United States Patent [19]

Williams et al.

[11] Patent Number: 5,472,561

[45] Date of Patent: Dec. 5, 1995

[54] RADIO FREQUENCY MONITOR FOR SEMICONDUCTOR PROCESS CONTROL

[75] Inventors: Norman Williams; James Spain, both of Austin, Tex.

[73] Assignee: Sematech, Inc., Austin, Tex.

[21] Appl. No.: 411,116

[22] Filed: Mar. 27, 1995

Related U.S. Application Data

[62] Division of Ser. No. 163,221, Dec. 7, 1993.

[51] Int. Cl.$^6$ ............................. H01L 21/306; B44C 1/22
[52] U.S. Cl. .................. 156/627.1; 156/345; 156/643.1; 216/61; 216/67
[58] Field of Search ............................. 156/626.1, 627.1, 156/345, 662.1, 657.1, 643.1; 216/59, 61, 67, 79; 204/192.33, 298.32; 324/126, 127

[56] References Cited

U.S. PATENT DOCUMENTS

| | | | |
|---|---|---|---|
| 4,115,184 | 9/1978 | Poulsen | 156/626 |
| 4,207,137 | 6/1980 | Tretola | 156/627 |
| 4,354,154 | 10/1982 | Schiemann | 324/126 |
| 4,602,981 | 7/1986 | Chen et al. | 156/627 |
| 4,954,212 | 9/1990 | Gabriel et al. | 156/627 |
| 4,963,819 | 10/1990 | Clarke et al. | 324/126 |
| 5,175,472 | 12/1992 | Johnson, Jr. et al. | 315/111 |
| 5,273,610 | 12/1993 | Thomas, III et al. | 156/345 |
| 5,401,350 | 3/1995 | Patrick et al. | 156/643 |
| 5,407,524 | 4/1995 | Patrick et al. | 156/627 |

FOREIGN PATENT DOCUMENTS 2-26023  1/1990  Japan.

OTHER PUBLICATIONS

"Measurement and analysis of radio frequency glow discharge electrical impedance and network power loss", J. W. Butterbaugh et al., J. Vac. Sci. Technol. A 8 (2), Mar./Apr. 1990, pp. 916–923 and Erratum, p. 578.

"Electrical characterization of radio–frequency discharges in the Gaseous Electronics Conference Reference Cell", Mark A. Sobolewski, J. Vac. Sci. Technol. A 10(6), Nov./Dec. 1992, pp. 3550–3562.

"Electrical measurements for monitoring and control of rf plasma processing", M. A. Sobolewski et al., SPIE vol. 1803 (1992), pp. 309–320.

"Beyond RF–Power Measurements", Paul Miller et al., NCSL meeting, Santa Clara, 11 Feb. 1993, pp. 1–16.

*Primary Examiner*—William A. Powell
*Attorney, Agent, or Firm*—William W. Kidd

[57] ABSTRACT

A RF sensor for monitoring voltage, current and phase angle of a RF signal being coupled to a plasma reactor. Outputs from the sensor are used to calculate various properties of the plasma. These values are then utilized to characterize the process and/or used to provide feedback for in-situ control of an ongoing plasma process.

8 Claims, 3 Drawing Sheets

RADIO FREQUENCY MONITOR FOR SEMICONDUCTOR PROCESS CONTROL

This application is a division of application Ser. No. 08/163,221, filed Dec. 7, 1993.

BACKGROUND OF THE INVENTION

1. Field of the Invention

The present invention relates to the field of semiconductor processing equipment and, more particularly, to a technique of monitoring voltage and current for control of an ongoing semiconductor process.

2. Prior Art

In the fabrication and processing of semiconductor wafers, such as silicon wafers, a variety of different semiconductor equipment and processes are utilized. The wafer processing techniques are well known in the prior art and include photolithography, deposition, etch, as well as a variety of other processes. Furthermore a variety of sensors and control equipment are associated with metrology for determining the performance of tools in the various manufacturing steps. Although equipment and process steps have improved over the years, the technique of monitoring the ongoing process has not necessarily kept pace with the other improvements. In the field of monitoring the ongoing semiconductor process, current practices generally rely on ex-situ monitoring. A problem with ex-situ monitoring is that the results are not available until the end of the process or, if intermediate readings are required, the ongoing process must necessarily be interrupted in order to obtain the required reading.

In the area of radio frequency (RF) signal monitoring, the art abounds with various devices and techniques for measuring a RF signal. However, in many instances, it is difficult to couple a particular sensor to obtain an accurate measurement of the RF signal. Sometimes, such RF monitors disrupt the process or fail to obtain accurate indications of the ongoing process. This is especially so with RF measurements of plasma reactors. Additionally, such techniques are not generally practiced in order to provide in-situ control of an ongoing manufacturing process. As stated above, complications are further heightened when invasive probes are utilized in a plasma reactor chamber.

The present invention provides for a RF monitor and a scheme for utilizing the RF monitor to control a plasma process. The RF monitoring device can be implemented economically, but without interfering with the plasma process.

SUMMARY OF THE INVENTION

The present invention describes a technique and a sensor for providing RF monitoring for control of a plasma process. The sensor of the present invention utilizes a voltage divider network to measure RF and DC voltage and a wire loop to measure the RF current. The voltage and current phase angle is also determined.

The sensor output is coupled to a DC voltmeter and to a RF vector voltmeter, which also determines the phase angle between the voltage and current. Signals from the voltmeters are entered into a computer for information retrieval and/or process control. From these signals, delivered power and load impedance can be calculated and, in addition, various parameters such as plasma sheath capacitance, ion mobility and ion density can be estimated using a model. These calculations not only provide information on plasma properties, but can be used for providing feedback for in-situ control of the ongoing process.

Finally, a procedure allows for proper calibration of the RF sensor. With a properly calibrated sensor with known correction coefficients, the sensor outputs will provide accurate RF signal measurements for appropriate calculations of plasma properties.

Economic Advantage

The RF monitoring apparatus of the present invention is a cost efficient device capable of controlling process parameters in a plasma reactor, which ultimately improves the yield and overall cost of producing a semiconductor device.

DETAILED DESCRIPTION OF THE PREFERRED EMBODIMENTS

A technique and a sensor for providing radio frequency (RF) monitoring for process control of a plasma process which is utilized in the fabrication of integrated circuits on a semiconductor wafer is described. In the following description, numerous specific details are set forth, such as specific parameters, measuring techniques, circuit components, etc., in order to provide a thorough understanding of the present invention. However, it will be obvious to one skilled in the art that the present invention may be practiced without these specific details. In other instances, well-known processes and devices have not been described in detail in order not to unnecessarily obscure the present invention.

Figure 1:
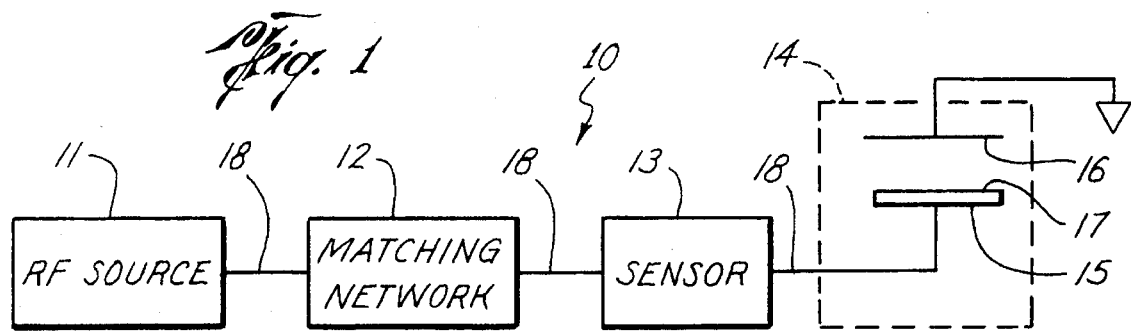
FIG. 1 is a circuit block diagram showing a reactor system and a placement of a RF sensor of the present invention within the system for measuring RF voltage, RF current, phase angle and DC bias voltage of a RF signal coupled to a reactor.

Referring to FIG. 1, a block diagram showing an utilization of a RF sensor of the present invention is shown. In this particular plasma system 10, an RF source in the form of an RF generator 11 is coupled to a processing reactor 14 through a matching network 12 by transmission line 18. The reactor 14 is shown having two electrodes 15 and 16 wherein a semiconductor wafer 17 resides upon one of the electrodes 15. In this particular reactor 14, the RF signal from the RF source 11 is coupled to one electrode 15 in reactor 14, while the other electrode 16 is coupled to ground. It is to be appreciated that the actual number of electrodes or the placement of the wafer 17 upon a particular electrode is not critical to the operation of the present invention. It is also to be noted that a variety of processing systems utilizing RF and/or microwave energy sources are well-known in the prior art and one of them can be readily substituted for system 10. Furthermore, the use of matching network 12 is preferred in order to match the RF energy from source 11 to reactor 14, but is not necessary to use the sensor of the present invention.

As is shown in FIG. 1, a RF sensor 13 of the present invention is inserted in transmission line 18, proximal to the reactor 14 and preferably disposed between the matching network 12 and reactor 14. However, it is to be appreciated that sensor 13 can be inserted between the source 11 and matching network 12 to measure the performance of the matching network 12. The purpose of sensor 13 is to function as a monitoring device to measure the RF signal being coupled to reactor 14. In order to obtain accurate results, it is preferable to place sensor 13 as near to the reactor 14 as possible in order to reduce any transmission line 18 loss between sensor 13 and reactor 14. In system 10, the reactor 14 is used to provide plasma deposition on or plasma etching of a semiconductor wafer, such as a silicon wafer. However, it should be readily noted that sensor 13 can be readily adapted for use with other tools and systems as well.

Figure 2:
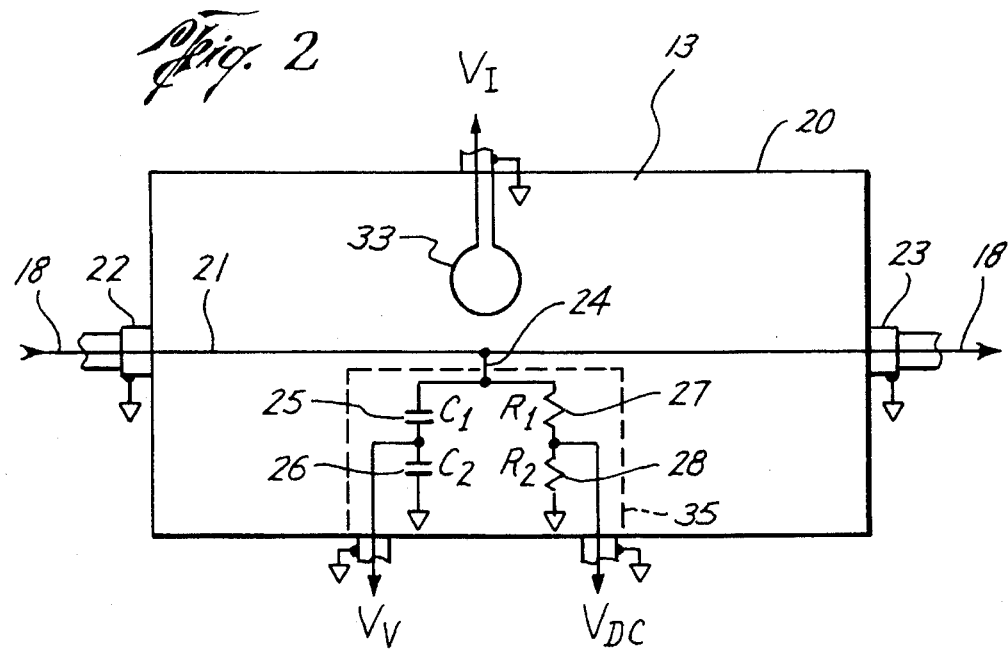
FIG. 2 is a circuit schematic diagram showing a use of voltage dividers and a current loop to measure RF voltage, DC bias voltage and RF current.

Referring to FIG. 2, the RF sensor 13 of the present invention is shown in detail. Sensor 13 is encased in a container 20 having electromagnetic radiation isolation capabilities. Container 13 is constructed from metal or some other material, such as plastic but having a conductive property in order to provide the electromagnetic shielding property. The technique of providing electromagnetic shielding by the use of metal or specialized containers is well-known in the art.

Within container 20 is a transmission line 21, which essentially functions as an insert on transmission line 18. One end of line 21 is coupled to an input connector 22 while the other end of line 21 is coupled to an output connector 23. The input connector 22 is coupled to the matching network 12 by line 18, while the output connector 23 is coupled to the reactor 14 by line 18. Thus, the transmission line 21 is coupled in series between the matching network and the reactor 14. Line 21 essentially becomes part of transmission line 18 for coupling RF power to reactor 14. It is preferable to have line 21 be electrically equivalent to that of line 18 for matching purposes. Since transmission line 21 is in a shielded container, it is bare without insulation. The bareness allows for adequate electromagnetic coupling for RF current readings.

It is appreciated that a particular embodiment of sensor 13 is utilized as the preferred embodiment. However, other designs can be readily adapted without departing from the spirit and scope of the present invention. Furthermore, the present invention can be readily adapted for use with other transmission medium as well. In the preferred embodiment, transmission line 18 external to the sensor 13 is a solid conductor transmission line, such as a coaxial line or a solid metal rod. With a coaxial line, it has a central conductor and a surrounding shielding ground. The central conductor is coupled to transmission line 21 through connector 22 or 23, while the shielding ground is coupled to ground potential. The preferred embodiment uses a conducting metal as the material for constructing container 20 to provide a conducting ground. The shielding of the coax is coupled to the ground of container 20.

As is noted in FIG. 2, three sensor outputs are obtained from sensor 13 of the present invention. The three outputs from sensor 13 are designated as RF voltage ($V_V$), RF current ($V_I$) and DC voltage ($V_{DC}$). A capacitive voltage divider network, comprised of capacitors 25 and 26 (having values $C_1$ and $C_2$, respectively), is coupled between transmission line 21 and ground. A short length of wire 24 is used to couple the capacitive voltage divider network to line 21 to tap the voltage on line 21. Output $V_V$ is obtained at the junction of the two capacitors 25 and 26. The voltage $V_V$ is a ratioed value, determined by the values $C_1$ and $C_2$, and is indicative of the RF signal voltage on transmission line 21. The capacitors 25 and 26 block the DC component, thereby providing an accurate indication of the RF voltage coupled to reactor 14.

A second voltage divider, comprised of resistors 27 and 28 (having values $R_1$ and $R_2$, respectively), is coupled to wire 24 and is in parallel to the capacitive voltage divider network. The resistors 27 and 28 operate as a resistive voltage divider at lower frequencies and a ratioed value of the voltage, which is determined by the values $R_1$ and $R_2$, on line 21 is obtained at the junction of resistors 27 and 28. The output $V_{DC}$ provides an indication of the DC bias potential being coupled to reactor 14. $V_{DC}$ is then coupled to a DC voltmeter, such as Hewlett-Packard Model 3457A, (or equivalent) to obtain a DC measurement indicating the DC bias potential. The voltmeter should have the capability of reading just the DC component of a signal coupled to it for an accurate DC reading.

Figure 3:
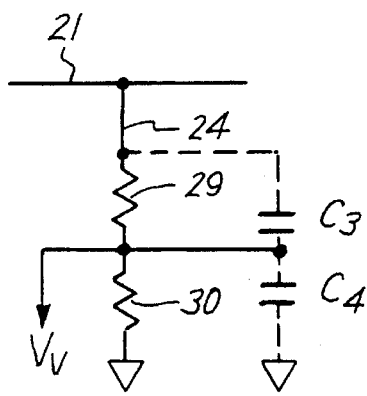
FIG. 3 is a circuit schematic diagram showing an alternative scheme to measure RF voltage at higher RF frequencies.

In an alternative embodiment, capacitors 25 and 26 can be readily replaced by a resistive network shown in FIG. 3. Because the RF signal typically has a fundamental frequency of greater than 10MHz, resistors 29 and 30 operate more as capacitors at these higher frequencies. At typical RF frequencies employed (above 10MHz), the impedance due to the stray capacitance of the resistors is much less than the (ohmic) resistor values themselves, resulting in electrical characteristics of a capacitive voltage divider. The values for resistors 29 and 30 can be used to provide the desired division. When using this technique resistors 29 and 30 can have the same $R_1$ and $R_2$ ratio as resistors 27 and 28). However, it is actually the capacitance values of resistors 29 and 30 which determine the dividing ratio. Generally, the capacitance is determined by the component 29 while capacitance $C_4$ is determined by component 30 plus capacitance of external probes and connections.

It should be noted that two separate divider networks are desired, since one output ($V_{DC}$ is coupled to a DC voltmeter, while the other output ($V_V$) is coupled to a separate measurement device. In order to reduce signal loss, wire leads should be maintained at a minimum between the components within sensor 13, as well as external to any measuring instruments.

The RF signal current value is obtained by utilizing a single loop pick-up coil 33 positioned proximal to the transmission line 21 near the node where wire 24 is located.

One terminal end of the coil 33 is coupled to ground while the other terminal end is coupled out of sensor 13 for providing an output as signal $V_I$. A designation of $V_I$ is used here since the RF signal is a voltage proportional to the current I, generated by an inductive coupling of the coil 33 to the electromagnetic field generated by the current on transmission line 21.

Since $V_V$ and $V_I$ are outputs representative of the actual RF voltage and current being coupled to reactor 14, $V_V$ and $V_I$ outputs are coupled to a vector voltmeter, such as Hewlett-Packard Model 8508A, (or equivalent) for obtaining the voltage utilized since the $V_V$ and $V_I$ outputs are also used to measure and current readings. A vector voltmeter (or equivalent) is the phase difference between the voltages and current components. This is the phase angle ø.

Although the actual values of the circuit components 25–30 and the design of the coil 33 are a design choice, the preferred embodiment utilizes the following values. $R_1$ is 50M ohms, while $R_2$ is 100K ohms. $C_1$ (or $C_3$) is approximately 0.2 pF and $C_2$ (or $C_4$) including the stray capacitance of the external circuitry, is approximately 50 pF. In reference to the coil 33, it has a coil loop diameter range of approximately ½–1½ cm and the nearest point of the coil 33 is positioned approximately 3–4 mm from transmission line 21. Because transmission line 21 is a bare wire, adequate inductive coupling is obtained. A fine gauge wire, such as a number 30 gauge wire, is utilized for the material of the wire for forming coil 33. Although the material of the wire for coil 33 is not critical, a fine gauge wire is preferred since its capacitive coupling to a voltage on the transmission line 21 will be minimized. The coil 33 can be insulated or uninsulated. The overall length of the wire is approximately 3–4 cm. This length should provide for the coil 33 to have an inductance value of approximately 2–3 nH.

Care must be taken to avoid resonant behavior by the components within container 20 and to shield the voltage dividers from inductive pick-up, both of which can cause erroneous phase readings. The voltage divider network is enclosed in a metal shield 35 in order to shield the divider network from transmission line 21. In the preferred embodiment, the voltage divider network(s) are shielded by enclosing the components completely within a metallic material.

Thus, from sensor 13, three outputs ($V_V$, $V_I$ and $V_{DC}$) are obtained. Values $V_V$ and $V_{DC}$ provide indications of the RF voltage and the DC bias voltage, respectively. The value $V_I$ provides an indication of the RF current. The $V_I$ and $V_V$ components when compared vectorially, provide the phase angle ø. Additionally, $V_V$ and $V_I$ can be frequency discriminated to obtain the fundamental and harmonic components of the RF signal, if desired. Simply, $V_V$ and $V_I$ are coupled through separate filters (not shown) for passing the fundamental frequency and/or one or more harmonic components. For example, a plasma etching reactor used with the present invention operates at a fundamental frequency of 13.56MHz. Filters are utilized to "cut-off" the harmonic frequencies. If a fourth harmonic component is of interest, appropriate filters would be used to pass only the 67.8MHz frequency band. Accordingly, a series of filters can be readily utilized for obtaining not only the fundamental, but first, second, third and fourth (etc.) harmonic components of the RF voltage and current.

Figure 4:
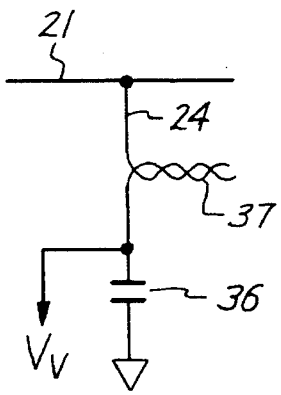
FIG. 4 is a circuit schematic diagram showing an alternative scheme to measure RF voltage at lower frequencies.

Referring to FIG. 4, an alternative RF voltage divider network of the present invention is shown. Instead of using the capacitive voltage dividers of capacitors 25 and 26 of FIG. 2 at lower frequencies in the range of 400 KHz to 2MHz this alternative configuration is used. The alternative configuration utilizes a capacitor 36 and a length of insulated twisted wire pair 37. Teflon™ insulation is preferred in order to withstand the high voltage on the transmission line. Essentially, an extended wire of about 2 cm long is used for wire 24 to couple to another extended lead of about 2 cm long. This second lead is coupled to capacitor 36. The two free extended leads are twisted together to form twisted wire 37. Typically, at the lower frequencies, the reactance of the stray capacitance and the resistance of the circuit of FIG. 3 are significant, thereby resulting in erroneous readings for $V_V$ and ø. However, the divider shown in FIG. 4 functions well at these lower frequencies since only capacitors are involved in the divider network and can be used instead of the circuit in FIG. 3 at lower frequencies. This alternative circuit has been successfully utilized under conditions where the RF voltage exceeds 1 KV and at an RF frequency as low as 400 KHz. The circuit of FIG. 4 can be used at high frequencies as well.

In the particular preferred alternative embodiment, capacitor 36 has a value of approximately 50 pF. The twisted wire 37 is formed from a teflon coated wire having two turns, which provides approximately 0.2 pF as the value of capacitance. It is to be noted that small capacitors in the order of less than 1 pF are small in physical size and have poor voltage stand-off capability. The capacitor formed by the twisted wire pair 37 provides for the required small value of capacitance, but due to the insulation, allows for a high stand-off voltage capability. At high frequencies, the twisted pair 37 will have a desired property closer to pure capacitance.

MEASUREMENTS

The sensor of the present invention is used to measure certain plasma properties commonly inherent in reactors utilized for processing semiconductor wafers. It is with that in mind that the following description should be read. However, those skilled in the art will understand that the present invention can be readily adapted for measurement of current and voltage values, as well as the phase angle, for other applications as well.

The sensor 13 of the preferred embodiment couples the outputs, $V_V$ and $V_I$, to a vector voltmeter which measures RMS values of $V_V$ and $V_I$. These measured RMS values are proportional to the RMS values of the RF voltage and current. These two values, when applied to the vector voltmeter (or other equivalent measurement device), will also provide the phase difference (ø) between the voltage and current. In those instances where DC bias voltage ($V_{DC}$) is desired, sensor 13 of the present invention also provides this measurement.

Also with the present invention a probe set for coupling the output of the sensor 13 to the measurement device(s) will be needed. The preferred embodiment utilizes active probes having high input impedance (greater than 100K ohms) and low input capacitance (less than 2–3 pF) with minimum cable length. Hewlett-Packard Model 41800A active probes are used in the taking of the measurements for the calibration below.

It should be appreciated that although the measured values are designed to be accurately proportional to the actual voltages and current, some difference will occur. The differences may be caused by a variety of factors, including circuit variations, tolerance errors, proportionality compensation of the divider and coil networks. Therefore, as will be noted later in the description, a calibration procedure is implemented to calibrate the sensor. The calibration procedure will produce a correction factor to each of the measured values.

Accordingly, the correction factor, when applied to the measured values will yield the actual signal values. Thus, $$V_V * K_V = V_{RF} \quad \text{(Equation 1)}$$

$$V_I * K_I = I_{RF} \quad \text{(Equation 2)}$$

$$V_{DC} * K_{DC} = V_{BIAS} \quad \text{(Equation 3)}$$

$$\phi_{MEASURED} + \Delta\phi = \phi_{ACTUAL} \quad \text{(Equation 4)}$$

$V_V$, $V_I$, $F_{DC}$ and $\phi_{MEASURED}$ are the measured values from the sensor 13; $K_V$, $KK_I$, $K_{Dc}$ and $\Delta\phi$ are correction factors applied to the measured values; and $V_{RF}$, $I_{RF}$, $V_{DC}$ and $\phi_{ACTUAL}$ are the corrected, actual values coupled to the reactor 14.

Assuming that for a load (plasma+chamber) impedance is given by:

$$Z_P = R_P j X_P \quad \text{(Equation 5)}$$

(when the load is capacitive, $X_P$ is positive in the equation) the following relationships will hold.

$$P = V_{RF} * I_{RF} * \sin \phi \quad \text{(Equation 6)}$$

where P is power in watts.

$$R_P = V_{RF}/I_{RF} * \sin \phi \quad \text{(Equation 7)}$$

where $R_P$ is the load resistance in ohms.

$$X_P = (-V_{RF}/I_{RF}) * \cos \phi + \omega L \quad \text{(Equation 8)}$$

where $X_P$ is the load reactance in ohms and $$\omega L = \text{load}/\tan \phi = 50\Omega/\tan \phi \quad \text{(Equation 9)}$$

(the value for $\omega L$ is further described later in the calibration procedure)

It is to be noted that the expression for power is normally known as $P=V*I*\cos \phi$. However, Equation 6 above uses sin $\phi$ for the reason that in this instance the current is sensed by a coil 33, which acts like a transformer and induces a 90° phase shift lag. Thus, $\cos (\phi-90°)=\sin \phi$. The other equations above also take into account this phase shift.

Aside from the calculations above, which are utilized for determining the response of the plasma, other performance characteristics can be determined as well. For example, another known technique is the use of the fundamental and harmonic component values of the RF signal to control the performance of the plasma. Such use of such control is described in a U.S. patent application entitled, "Independent Control of Voltage and Current in High Frequency Electrical Discharges", Ser. No. 934,091, filed on Aug. 21, 1992. Furthermore, other plasma parameters which can be readily calculated or estimated are described below. Definitions and descriptions are given first prior to the parameter derivations in order to clearly identify the particular characteristic of concern.

Plasma Density and Plasma Potential

In a plasma, the number of electrons per cm³ is approximately equal to the number of ions per cm³ such that charge neutrality is obtained. The values are not exactly equal since some high energy electrons are able to escape due to their high velocity. This leaves the plasma with a small net positive charge and a potential known as the plasma potential ($V_P$). Electron density, $n_e$, and ion density $n_i$, are each loosely termed the plasma density since $n_i$ is approximately equal to $n_e$. A typical value in a modern etcher tool $10^{11}$ ions per cm³. The plasma potential $V_P$ is typically 20 volts positive with respect to ground in a typical etcher.

Sheath Formation and Capacitance

When a plasma comes into contact with a conducting electrode, a sheath (or dark space) forms automatically so that the plasma may retain the approximate charge neutrality. The conducting electrode may be grounded, floating, at a DC potential or at an oscillating potential and a sheath will still form in each instance. The sheath characteristics, such as its width (distance from the electrode to the plasma boundary), depend on the plasma density, the electron temperature and the voltage on the electrode. The number of electrons and ions in the sheath is much less than in the plasma itself and appears electrically like a capacitor with a gap equal to the sheath thickness. It is valid to assume that the electrode area approximately equals the wafer area (or the electrode area on which it sits) in most reactors.

Ion Mobility

When an ion in a plasma moves under the influence of an electric field it is accelerated by the field until it collides with another particle (neutral or ion particle) and loses this energy. The events of acceleration and collision are repeated many times and the ions appear as if they have an average velocity which is proportional to the electric field strength. The constant of proportionality is called the mobility and has the units of cm² per second per volt.

$$\text{Mobility} = \text{Velocity}/\text{Electric field} \quad \text{(Equation 10)}$$

$$\text{Mobility} = (\text{cm/second})/(\text{volts/cm})$$

$$= \text{cm}^2 \text{sec}^{-1} \text{volt}^{-1}$$

Thus, with this understanding the following estimation of quantities can be made from the voltage and current values obtained from the sensor 13 measurements.

Sheath Capacitance and Width

To measure sheath capacitance and width, measure the imaginary impedance ($X_P$) on the assumption that this is all due to the sheath capacitance. Other stray capacitances can be measured separately and corrected for in an appropriate fashion, if desired. The calculation is as follows:

$$X_P - 1/\omega C_{SH} \text{ ohms} \quad \text{(Equation 11)}$$

where $\omega$=angular frequency of RF, which is equal to $8.52 \times 10^7$ at a frequency of 13.56 MHz. $C_{SH}$ is the sheath capacitance in farads.

$$C_{SH} = \epsilon \epsilon_o A / d_{SH} \quad \text{(Equation 12)}$$

Where $\epsilon$ is the dielectric constant of the sheath (assumed equal to 1), A is the area of wafer (or electrode), $d_{SH}$ equals the sheath thickness or width and $\epsilon_o$ equals $8.842 \times 10^{-12}$ Farads per meter. In equation 12, A is in m² square and $d_{SH}$ is in meters (m).

Thus, $c_{SH}$ and $d_{SH}$ can be estimated from a measurement of $X_P$.

Ion Mobility in Plasma To measure ion mobility, measure the real load resistance ($R_P$) on the assumption that this is resistance of the plasma resulting from ionic motion. Ion current density is noted as $$j_i = n_i e v_i \quad \text{(Equation 13)}$$

where $n_i$ is the ion density in the plasma, e is the electron charge and $v_i$ is the mean ion velocity. Further, $$v_i = \mu_i E \quad \text{(Equation 14)}$$

where $\mu_i$ is ion mobility and E is the electric field, and the total ion current in the plasma is $$I_i = j_i A \quad \text{(Equation 15)}$$

where A is the area of the plasma cross-section (similar to the area of the wafer or electrode).

Combining these equations results in $$I_i = A n_i e \mu_i E \quad \text{(Equation 16)}$$

and since $$E = V/d_P \quad \text{(Equation 17)}$$

where V is voltage across a plasma of thickness $d_P$, it follows that $$\frac{V}{I_i} = R_P = \frac{d_P}{n_i e \mu_i A} \quad \text{(Equation 18)}$$

Thus, $\mu_i$ can be estimated if $n_i$ is known (see next) or or measured independently. The variable $d_P$ is approximately equal to the gap between the electrodes.

Ion Density (Electron Density)

The ion flux crossing the sheath boundary is given by $$n_i v_i = 0.6 n_e \sqrt{\frac{kT_e}{m_i}} \quad \text{(Equation 19)}$$

where $n_e$ is the electron density, $T_e$ is the electron temperature in degrees Kelvin, $m_i$ is the ion mass and k is the Boltzmann constant equal to $1.38 \times 10^{-23}$ Joules per degree Kelvin. The square root quantity is the ion velocity corresponding to an electron temperature $T_e$. The value $kT_e$ for many plasmas is about 5 electron volts (eV).

The total ion current crossing the sheath is given by $$I_i = j_i A = n_i e v_i A = 0.6 n_e e A \sqrt{\frac{kT_e}{m_i}} \quad \text{(Equation 20)}$$

Thus, by measuring the ion current $I_i$, values of $n_e$ and $T_e$ may be compared to those values obtained independently, such as from Langmuir probe measurements. In the above, if $kT_e$ was in fact 5 eV then $n_e$ would typically be approximately $10^{11}$ electrons per $cm^3$ for an ion current of about one amp into a 200 mm diameter silicon substrate. The ion density is about the same as this. The value $T_e$ can be determined independently by using a Langmuir probe.

Figure 5:
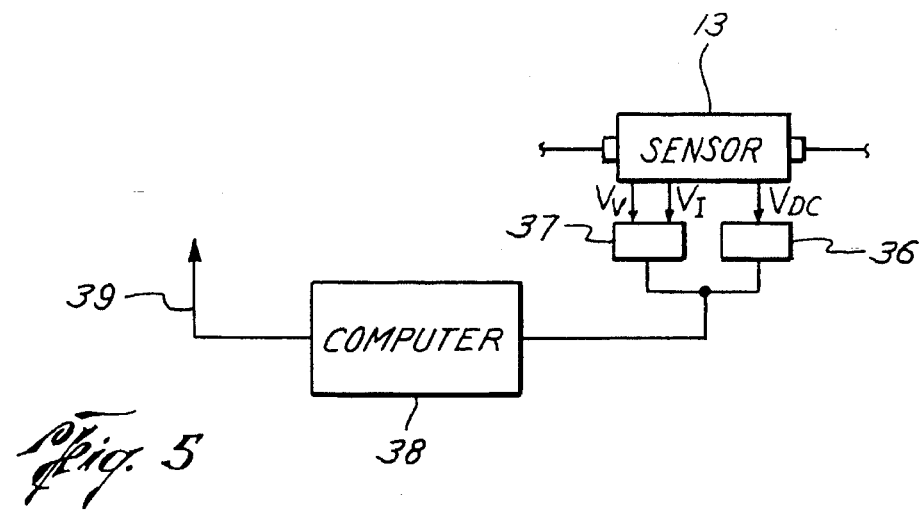
FIG. 5 is a circuit block diagram showing a use of a computer coupled to receive output values from the sensor in order to provide a feedback signal for controlling an ongoing plasma process.

Therefore, the output values from the sensor of the present invention can be utilized to estimate a number of plasma parameters and performance characteristics. Furthermore, as is noted in FIG. 5, the output values from the sensor are measured by the DC voltmeter 36 (or its equivalent) and vector voltmeter 37 (or its equivalent) and their outputs, which includes the phase angle, can be readily entered into a computer 38, such as a personal computer (PC), for calculating the values described above from the real and imaginary parts of the load impedance and the ion current.

Not only can these values be calculated and stored, but a feedback control signal 39 can be generated by the computer 38 in order to provide control of the ongoing plasma process. The control can be in real time for providing in-situ control. For example, if a calculated value is out of tolerance for a given process, a feedback signal from the computer can be readily utilized to control the RF generator (or other equipment) to bring the parameter(s) within a desired tolerance range. Thus, not only can information about the reactor can be obtained from the sensor of the present invention, but in-situ control of the plasma process can also be effected with the practice of the present invention.

Calibration

It is appreciated that the sensor 13 of the present invention will function as designed to provide an accurate reading only if it is operating within its calibrated limits. Therefore, it is imperative that the sensor 13 be calibrated to provide an accurate representation of $V_{RF}$, IRF, $V_{DC}$ and ø. One calibration procedure for use in calibrating the sensor 13 is described below.

Figure 6:
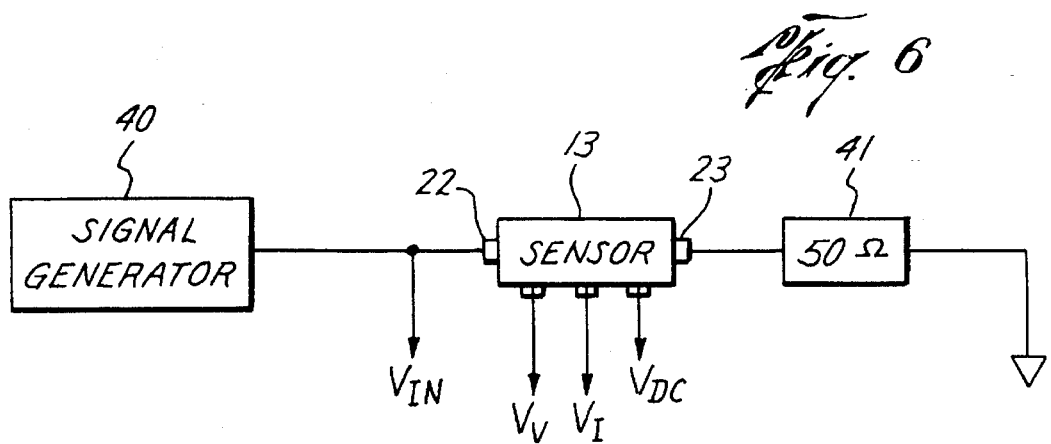
FIG. 6 is a circuit block diagram showing a calibration set-up for the sensor of the present invention to determine calibration coefficients for the outputs from the sensor.

Referring to FIG. 6, a signal generator 40 is coupled to the input connector 22 of sensor 13 while a load 41 (in this instance a 50 ohm precision terminator) is coupled to the output connector 23 of sensor 13. The calibration technique is as follows:

Step 1: Vary the signal generator 40 frequency in 5 or 10 MHz intervals over the range 10 to 100 MHz and measure $V_{IN}$, $V_V$, $V_I$ and phase ø ($V_{IN}$ is the value of the RF voltage at the input of sensor 13). The value of $V_{IN}$ should have a RMS value of about 1V with the sensor having a 50 ohm precision load 41 coupled at its output.

Step 2: Normalize $V_V$ and $V_I$ by the value $V_{IN}$ to obtain the corrected values if $V_{IN}$ is not exactly equal to 1.

$$V_{V(CORR)} = V_V / V_{IN} \quad \text{(Equation 21)}$$

$$V_{I(CORR)} = V_I / V_{IN} \quad \text{(Equation 22)}$$

Figure 7:
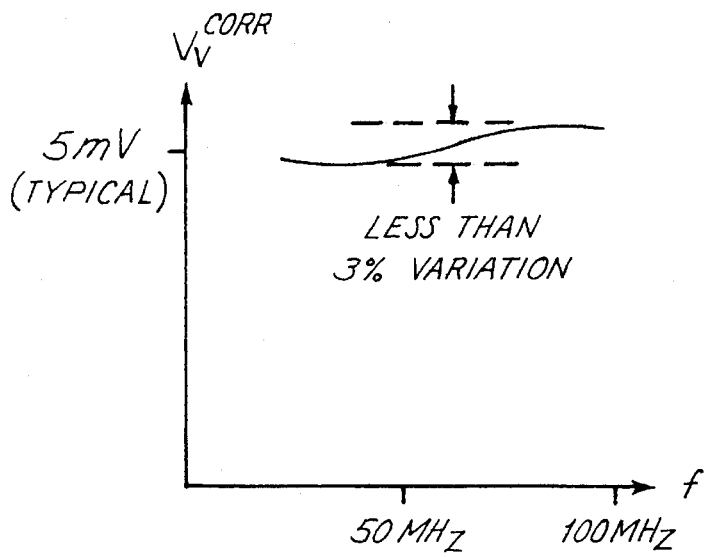
FIG. 7 is a graphical diagram showing a plot of sensor voltage output, which is indicative of RF voltage, versus frequency when the sensor is operating properly.
Figure 8:
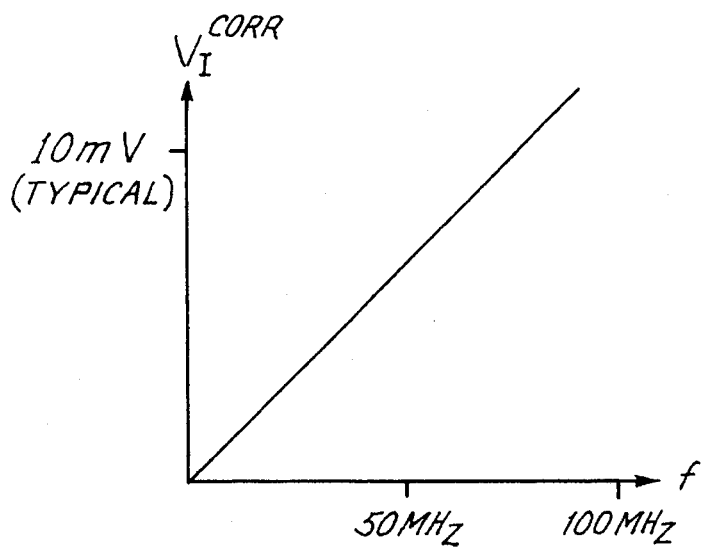
FIG. 8 is a graphical diagram showing a plot of sensor voltage output, which is indicative of RF current, versus frequency when the sensor is operating properly.
Figure 9:
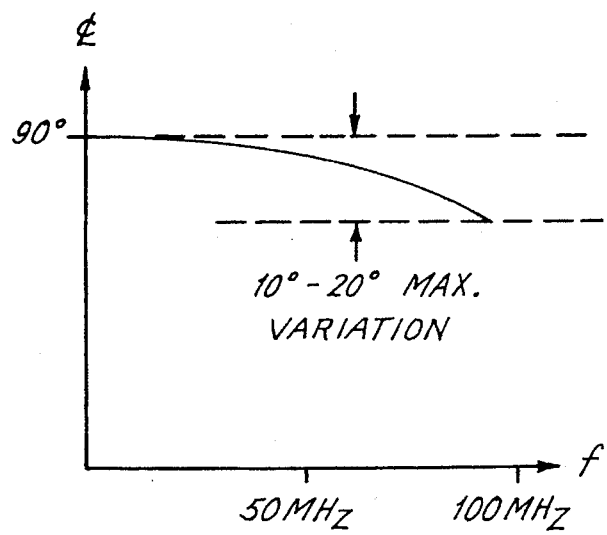
FIG. 9 is a graphical diagram showing a plot of phase angle versus frequency when the sensor is operating properly.

Step 3: Plot $V_{V(CORR)}$, $V_{I(CORR)}$ and ø versus frequency. The plots for these values typically will resemble the graphs shown in FIGS. 7, 8, and 9.

Step 4: If the frequency plots obtained correspond to those shown in FIGS. 7–9, then set the frequency of signal generator to the operating RF frequency of the plasma, such as 13.56 MHz. If a harmonic frequency is to be measured then that harmonic frequency should be selected for the signal generator and the response calibrated.

Step 5: Obtain the $V_{IN}$, $V_{V(CORR)}$, $V_{I(CORR)}$ and ø values at the appropriate fundamental and/or harmonic frequencies with the sensor in the circuit. It should be noted that the phase difference of current and voltage from the signal generator should have a phase difference of 90° at frequencies below about 15 MHz. If this is not the case then a phase offset (Δø) will need to be included in the calculation to make the phase equal to the ideal 90°. At higher frequencies a fall off in phase angle is due to the self inductance of the conductor 21 and is corrected by the inclusion of a non-zero value of ωL (noted below). However, improper or inadequate shielding of the sensor circuitry can cause phase shifts and this situation should be corrected before inserting arbitrary offsets. An offset of no more than ±2° should be applied at 13.56 MHz.

Step 6: Quantities $K_V$, $K_I$ and Δø and ωL are entered into the computer for the particular sensor and probe set being calibrated. It should be noted that all probes, filters, cables, etc., normally used during actual operations should be utilized here. However, the filters must be omitted for the variable frequency tests. Calibration factors $K_V$, $K_I$ and ωL are calculated as follows at the chosen frequency of operation:

$$K_V = V_{IN} / V_V \quad \text{(Equation 23)}$$

$$K_I = V_{IN}/(50\Omega * V_I) = I_{IN}/V_I \quad \text{(Equation 24)}$$

$$\omega L = 50\Omega/\tan \phi \quad \text{(Equation 25)}$$

The quantities $K_V$, $K_I$, $\Delta\phi$ and $\omega L$ are entered into the computer for that particular sensor and probe set.

Step 7: If DC bias voltage measurements are to be required, then the following bias calibration procedure is performed. A DC bias from 0 to ±150 volts is applied to the input of the sensor 13 with the DC bias supply replacing the RF signal generator and 50 ohm precision terminator. The output $V_{DC}$ from sensor 13 is then measured on a precision voltmeter and the calibration constant determined by $$K_{DC} = V_{IN(DC)}/V_{DC} \quad \text{(Equation 26)}$$

$K_{DC}$ is also entered into the computer.

The above calibration procedure (Steps 1 through 7) should be repeated often enough to ensure accurate response from sensor 13.

Figure 10:
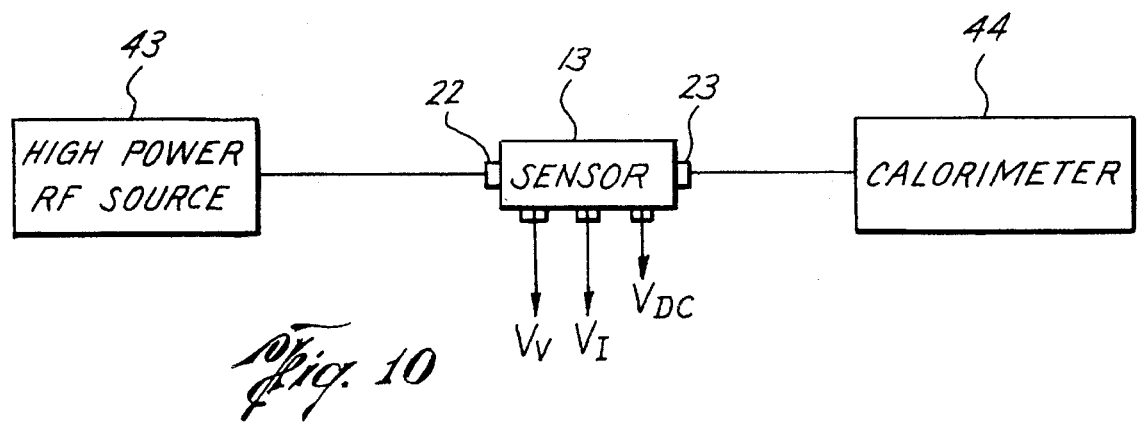
FIG. 10 is a circuit block diagram showing a calibration set-up for performing high power calibrations to calibrate the sensor of the present invention.

Although a power calibration is not essential, the following power calibration procedure is described for added assurances to check the accuracy of the sensor 13. Referring to FIG. 10, a high power RF generator 43 is coupled to sensor 13 input, while the output of sensor 13 is coupled to a calorimeter 44 having an input impedance of 50 ohms. The calibration steps are as follows.

Step 1: At the operating frequency, such as at 13.56 MHz, vary the input power in 100 watt steps from 100 watts to 700 watts and record the output $V_V$, $V_I$ and $\phi$. Again, it may be necessary to include the $\Delta\phi$ offset to obtain the correct phase difference between $V_V$ and $V_I$. The phase difference should be 90°±1° at all power values.

Step 2: The power reading of the calorimeter 44 is noted. The calorimeter 44 reading is indicative of the input power to the calorimeter 44. The power from the sensor can be calculated as $$P_{sensor} = (K_V V_V) * (K_I * V_I) \quad \text{(Equation 27)}$$

$P_{sensor}$ value should correspond to the actual calorimeter 44 power value within 1 to 2 percent. The correction factors are the same values obtained earlier.

Step 3: Finally, the calorimeter 44 input impedance is checked. The value is noted as $$Z_{IN} = \frac{K_V V_V}{K_I V_I} \quad \text{(Equation 28)}$$

The $Z_{IN}$ value should be 50±1 ohm. A 1 ohm deviation implies an accuracy of ±2 percent. This 2 percent difference should not be exceeded for all power levels from the RF generator 43. If the sensor output values correspond to the calorimeter values for all power levels, then the sensor is functioning properly and can be utilized for its intended purpose.

Thus, a RF sensor and a monitoring scheme for providing process control for a semiconductor process is described. Additionally, the RF monitoring device of the present invention can be implemented economically, but without interfering with the plasma process. Furthermore, the various calculations made by the computer based on the inputs from the sensor can provide not only information on plasma properties, but can be used to provide feedback for in-situ control of the ongoing process.

Further, it should be noted that more than one sensor can be utilized to measure the RF signal. For example, in reactors where both electrodes are powered (coupled to a power source) two sensors should be used, one for each transmission line to its electrode. Additionally, the DC measurement ($V_{DC}$) is not necessarily needed, but may be used to minimize damage to sensitive devices during plasma etch by ensuring that the value of $V_{DC}$ (and hence the ion incident energy) does not exceed some predetermined value.

Finally, the sensor can be placed prior to the matching network as well to monitor the response of the matching network. It then provides information on how well the load (plasma) impedance is matched to the RF generator impedance. With the earlier noted power measurements, a power measurement with the sensor in this position will determine the power loss in the matching network.

We claim:

1. In a plasma processing apparatus, having a reactor for processing a gas and wherein said reactor is coupled to a radio frequency (RF) source by a transmission line, a method of manufacturing a semiconductor device by accurately monitoring RF voltage and current being supplied by said RF source to said reactor on said transmission line, comprising the steps of:

providing a first capacitor coupled between a first node and said transmission line;

providing a second capacitor coupled between said first node and a common return;

said first and second capacitors providing a capacitive voltage divider network wherein a first voltage output at said first node is a proportional representation of said RF voltage on said transmission line;

providing a wire loop disposed next to said transmission line at a point on said transmission line where said first capacitor is coupled but having an air gap between said loop and said transmission line, such that electromagnetic field lines generated by current flow in said transmission line is inductively coupled to said loop, wherein voltage induced in said loop by said current flow provides a second voltage output which is a proportional representation of said RF current on said transmission line;

providing an electromagnetic shielding, disposed around said first and second capacitors, inhibits electromagnetic interference from interacting with said first and second capacitors which interference can cause erroneous first voltage output at said first node;

said first and second voltage outputs providing for accurate measurement of said RF voltage and current and said measurement is also used to accurately determine a phase difference between said RF voltage and RF current.

2. The method of claim 1 further including a step of providing a first resistor coupled between a second node and said transmission line and a second resistor coupled between said first node and said common return to provide a resistive voltage divider network, wherein a third voltage output at said second node, when filtered for DC, provides a proportional representation of DC bias voltage on said transmission line.

3. The method of claim 2 wherein said steps of providing said first and second capacitors provide for said first capacitor to have an approximate value of 0.2 pF and said second capacitor to have an approximate value of 50 pF.

4. The method of claim 3, wherein said step of providing said wire loop provides for said wire loop to have an approximate diameter of ½–1½ cm., its nearest point being approximately 3–4 mm from said transmission line and also for said wire loop to have sufficient length equivalent to an inductive value of approximately 2–3 nH.

5. The method of claim 4 wherein said step of providing said first capacitor forms said first capacitor from an insulated twisted wire pair in order to obtain said 0.2 pF capacitance, but wherein insulation of said insulated twisted wire pair prevents breakdown of said first capacitor when said RF voltage exceed 1 kilovolt.

6. The method of claim 5 wherein said steps which provide said first and second voltage outputs provide said outputs to determine plasma parameters of ion mobility in plasma, ion density, and plasma sheath characteristic during manufacture of said semiconductor device.

7. The method of claim 6 further including a step of providing a processor coupled to receive said voltage outputs for processing said voltage outputs to monitor said plasma parameters within said reactor, comparing said plasma parameters to predetermined acceptable tolerance values for such parameters, and providing a feedback signal to adjust said RF source when said plasma parameters are out of tolerance from said predetermined values.

8. The method of claim 7 wherein said steps are implemented to fabricate semiconductor devices on silicon wafers.

* * * * *

UNITED STATES PATENT AND TRADEMARK OFFICE
CERTIFICATE OF CORRECTION

PATENT NO. : 5,472,561  
DATED : December 5, 1995  
INVENTOR(S) : Norman Williams and James Spain Page 1 of 2

It is certified that error appears in the above-indentified patent and that said Letters Patent is hereby corrected as shown below:

Column 1, line 21, insert --,-- after "Furthermore".

Column 4, line 52, remove ")".

Column 4, line 59, "($V_{DC}$is" should be --($V_{DC}$) is--.

Column 5, lines 12 and 13, remove "utilized since the $V_v$ and $V_I$ outputs are also used to measure".

Column 5, line 14, after "is" insert --utilized since the $V_v$ and $V_I$ outputs are also used to measure--.

Column 7, line 13, "$F_{DC}$" should be --$V_{DC}$--.

Column 7, line 14, "KK$_I$" should be --K$_I$--.

UNITED STATES PATENT AND TRADEMARK OFFICE
CERTIFICATE OF CORRECTION

PATENT NO. : 5,472,561
DATED : December 5, 1995
INVENTOR(S) : Norman Williams and James Spain It is certified that error appears in the above-indentified patent and that said Letters Patent is hereby corrected as shown below:

Column 7, line 15, "$V_{DC}$" should be --$V_{BIAS}$--.

Column 7, line 21, "$Z_P=R_PjX_P$" should be --$Z_P=R_P - jX_P$--.

Column 7, line 39, insert --.-- after ")".

Column 8, lines 29 and 30, "Mobility = Velocity/ Electric Field" should be --Mobility = Velocity/Electric Field--.

Column 8, line 45, "$X_P-1/\omega C_{SH}$ ohms" should be --$X_P=1/\omega C_{SH}$ ohms--.

Column 8, line 56, remove "square".

Column 8, line 60, "To measure" should begin a new paragraph.

Column 9, line 22, remove "or".

Column 10, line 1, remove "can".

Column 19, line 13, "IRF" should be --$I_{RF}$--.

Column 12, line 63, remove ",".

Signed and Sealed this

Nineteenth Day of August, 1997

BRUCE LEHMAN

*Attest:*

*Attesting Officer*     *Commissioner of Patents and Trademarks*